(12) United States Patent
Hyun

(10) Patent No.: US 9,484,247 B2
(45) Date of Patent: Nov. 1, 2016

(54) SEMICONDUCTOR DEVICE HAVING STABLE STRUCTURE AND METHOD OF MANUFACTURING THE SAME

(71) Applicant: SK hynix Inc., Icheon-si Gyeonggi-do (KR)

(72) Inventor: Chan Sun Hyun, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 15/092,678

(22) Filed: Apr. 7, 2016

(65) Prior Publication Data

US 2016/0225663 A1    Aug. 4, 2016

Related U.S. Application Data

(62) Division of application No. 14/601,709, filed on Jan. 21, 2015, now Pat. No. 9,337,091.

(30) Foreign Application Priority Data

Aug. 28, 2014   (KR) ........................ 10-2014-0113298

(51) Int. Cl.
*H01L 23/48* (2006.01)
*H01L 21/768* (2006.01)

(52) U.S. Cl.
CPC ... *H01L 21/76802* (2013.01); *H01L 21/76843* (2013.01); *H01L 21/76877* (2013.01); *H01L 21/76897* (2013.01)

(58) Field of Classification Search
CPC .................. H01L 21/76802; H01L 21/76843; H01L 21/76877; H01L 21/76879; H01L 21/76897; H01L 23/528; H01L 23/5226
USPC .......................................... 257/774; 438/666
See application file for complete search history.

(56) References Cited

U.S. PATENT DOCUMENTS 9,236,395 B1 *  1/2016  Sasaki ............... H01L 27/11582

* cited by examiner

*Primary Examiner* — Tu-Tu Ho
(74) *Attorney, Agent, or Firm* — William Park & Associates Ltd.

(57) ABSTRACT

The semiconductor device includes a stacked structure including conductive layers and insulating layers alternately stacked; semiconductor patterns configured to pass through the stacked structure; and contact plugs electrically coupled to the conductive layers, respectively, wherein each of the conductive layers includes a first region which has a first thickness, and a second region electrically coupled to the first region and a second thickness greater than the first thickness, and a second region of a lower conductive layer located under a second region of an upper conductive layer.

11 Claims, 15 Drawing Sheets

SEMICONDUCTOR DEVICE HAVING STABLE STRUCTURE AND METHOD OF MANUFACTURING THE SAME

CROSS-REFERENCE TO RELATED APPLICATION

The present application is a Division of U.S. application Ser. No. 14/601,709, filed on Jan. 21, 2015, and the present application claims priority to Korean patent application number 10-2014-0113298 filed on Aug. 28, 2014, in the Korean Intellectual Property Office, the entire disclosure of which is incorporated by reference herein.

BACKGROUND

1. Technical Field

The invention relates to a semiconductor device and a method of manufacturing the same. More specifically, the invention relates to a 3-dimensional semiconductor device and a method of manufacturing the same.

2. Related Art

A nonvolatile memory is a memory device, which maintains stored data although a power supply cuts off. Recently, since improvement of integration of a 2-dimensional memory device, which forms a memory cell on a silicon substrate as a single layer, has reached a limit, a 3-dimensional nonvolatile memory device, which has vertically stacked memory cells on a silicon substrate, has been proposed.

The 3-dimensional memory device includes alternately stacked interlayer insulating layers and word lines, and channel layers, which pass therethrough, and memory cells are stacked along the channel layers. Also, contact plugs are connected to the stacked word lines, respectively, thereby selectively operating desired memory cells.

However, in order to realize the above-mentioned structure, contact plugs having various depths should be formed, and thus, difficulty of a process is high. Also, since the contact plug passes through the word line, there is a possibility of causing a bridge.

SUMMARY

An aspect of the invention provides a semiconductor device that includes a stacked structure including conductive layers and insulating layers alternately stacked. The semiconductor device also includes semiconductor patterns configured to pass through the stacked structure. The semiconductor device also includes contact plugs electrically coupled to the conductive layers, respectively. Each of the conductive layers includes a first region which has a first thickness, and a second region electrically coupled to the first region and a second thickness greater than the first thickness, and a second region of a lower conductive layer located under a second region of an upper conductive layer.

An aspect of the invention provides a method of manufacturing a semiconductor device including forming a stacked structure in which sacrificial layers and insulating layers are alternately stacked and a first region and a second region are defined. The method also includes forming a first slit which passes through the first region of the stacked structure, and a second slit which passes through the second region. The method also includes forming a mask pattern which covers the second slit and exposes the first slit on the stacked structure. In addition, the method includes removing the sacrificial layers of the first region through the first slit, and forming first openings. The method also includes forming first conductive layers in the first openings. The method also includes forming a first slit insulating layer which fills the first slit. The method also includes removing the sacrificial layers of the second region through the second slit and forming second openings. In addition, the method also includes etching partial thicknesses of the insulating layers to expand thicknesses of the second. In addition, the method includes forming second conductive layers in the second openings.

An aspect of the invention includes a semiconductor device that includes conductive layers and insulating layers that are alternately stacked. The semiconductor device also includes contact plugs electrically coupled to pad regions of the conductive layers. Each of the conductive layers include a cell region with a thickness less than a thickness of the pad regions and a region of a lower conductive layer configured under a region of an upper conductive layer.

BRIEF DESCRIPTION OF THE DRAWINGS

FIGS. 2A to 7A, and 2B to 7B are views illustrating a method of manufacturing a semiconductor device according to an embodiment of the invention;

DETAILED DESCRIPTION

Hereinafter, embodiments of the invention will be described in detail with reference to the accompanying figures. In the following description and the appended figures, detailed descriptions of well-known functions or constructions will be omitted if they obscure the invention with unnecessary detail. In addition, the invention may be embodied in different forms and should not be construed as limited to the embodiments set forth herein. The embodiments described herein are only provided so as a skilled person in the art of the invention can embody the inventive concept of the invention. The invention is directed to a semiconductor device having a stable structure, and a method of manufacturing the same.

Throughout this specification, it will be understood that when a portion is "electrically coupled to" another portion, the portion may be "directly electrically coupled to" another portion, or the portion may be "indirectly electrically coupled to" another portion with an intervening element between the portions. Throughout this specification, it will be understood that when a portion "includes" another portion, without any contrary statement, the portion should not exclude another element, but may include another element.

Figure 1:
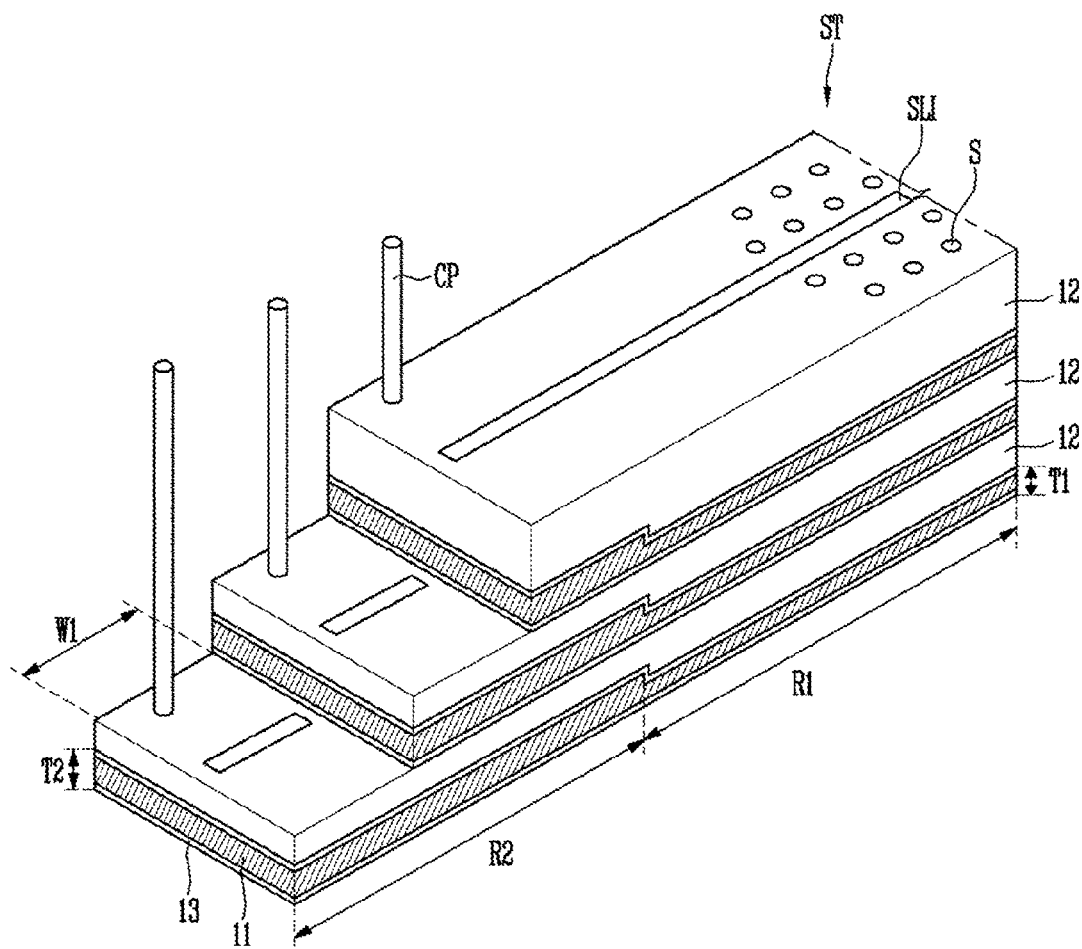
FIG. 1 is a perspective view illustrating a structure of a semiconductor device according to an embodiment of the invention.

Referring to FIG. 1, a perspective view illustrating a structure of a semiconductor device according to an embodiment of the invention is described.

In FIG. 1, the semiconductor device according to an embodiment of the invention includes a stacked structure ST, and the stacked structure ST includes conductive layers 11 and insulating layers 12 which are alternately stacked. In addition, one sidewall of the stacked structure ST may be patterned in a stair shape. Here, each step may include at least one conductive layer 11 and at least one insulating layer 12, and the conductive layer 11 or the insulating layer 12 may be disposed as an uppermost layer of each stair.

The conductive layers 11 may be a gate electrode of a selection transistor or a memory cell. Further, a barrier layer 13, which surrounds the conductive layers 11, may be further formed. For example, the conductive layer 11 may include a conductive material such as tungsten (W), tungsten nitride (WNx), and/or the like. In addition, the barrier layer 13 may include a conductive material such as titanium (Ti), tantalum (Ta), titanium nitride (TiN), tantalum nitride (TaN), and/or the like. In addition, although not shown in the figures, a nonconductive material layer such as an oxide layer, a nitride layer, and/or the like, may be further formed in the conductive layer 11, or a seam may be included.

Each of the conductive layers 11 may include a first region R1 and a second region R2 electrically coupled to the first region R1. Here, the first region R1 is a cell region, in which memory strings are disposed. In addition, the second region R2 may be pad regions, in which contact plugs CP are electrically coupled. The first region R1 may have a first thickness T1, and the second region R2 may have a second thickness T2 greater than the first thickness T1. For example, the second regions R2 of the conductive layers 11 may be in the stair shape, and a second region R2 of a lower conductive layer 11 may be located under a second region R2 of an upper conductive layer 11. In the above case, the first regions R1 of the conductive layers 11 have substantially the same length, and the second region R2 of the lower conductive layer 11 has a greater length than the second region R2 of the upper conductive layer 11. In the figures, although each stair has substantially the same width W1, the width W1 may be decreased or increased in an upper direction.

The insulating layers 12 are configured to electrically insulate gate electrodes. For example, the insulating layers 12 may include an oxide, a nitride, and/or the like. The insulating layers 12 may have substantially the same thickness as or a different thickness from the conductive layers 11. For instance, the insulating layers 12 may have substantially the same thickness as the first region R1 of the conductive layers 11. In addition, an uppermost insulating layer 12 may have a thickness greater than remaining insulating layers 12.

The semiconductor device may further include semiconductor patterns S which pass through the stacked structure ST. Here, the semiconductor patterns S may include doped polysilicon, undoped polysilicon, and/or the like. The semiconductor patterns S may be located to pass through the first region R1 of the conductive layers 11, and be a channel layer of the memory string. In addition, some of the semiconductor patterns S, which are located adjacent to the second region R2, may be a dummy channel layer.

The semiconductor device may further include a slit insulating layer SLI which passes through the stacked structure ST and is interposed between the semiconductor patterns S. For example, the slit insulating layer SLI may have a line shape which extends from the first region R1 to the second region R2 of the conductive layers 11. In the figure, the slit insulating layer SLI is only described to have a straight line shape. However, the slit insulating layer SLI may have a bent shape. In addition, the slit insulating layer SLI may be formed to have a shape in which a plurality of insulating layers formed in an individual process are electrically coupled. The slit insulating layer SLI may be formed to have an island shape in each stair of the second region R2 having the stair shape.

According to the above-mentioned structure, each of the conductive layers 11 have a greater thickness in the second region R2 than that in the first region R1. Further, the second region R2 of the lower conductive layer 11 is disposed under the second region R2 of the upper conductive layer 11. As described above, the thickness of the second region R2, for example, the pad region, is selectively increased. Accordingly, a bridge between the conductive layers 11 may be prevented when the contact plugs CP are formed. Further, the thickness of the stacked structure ST may be decreased.

Referring to FIGS. 2A to 7A and 2B to 7B, views illustrating a method of manufacturing a semiconductor device according to an embodiment of the invention are described. The drawing 'A' of each number illustrates a layout of the semiconductor device, and the drawing 'B' of each number illustrates a cross-sectional view taken along line A-A' of each of the drawings 'A'.

Figure 2A:
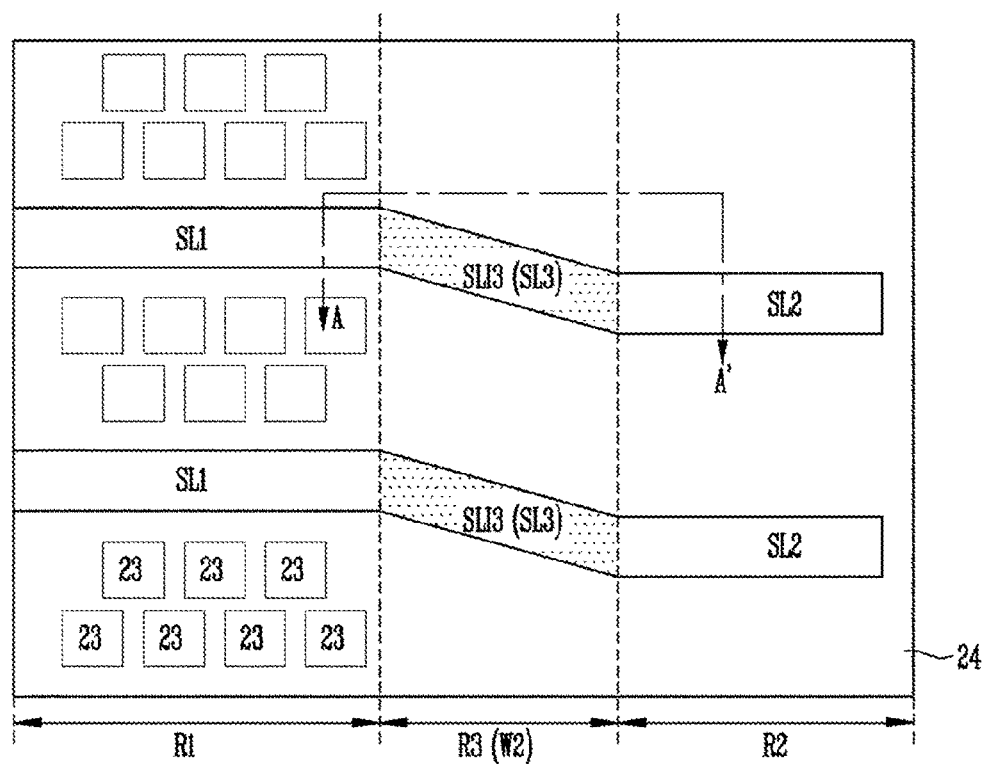
Figure 2B:
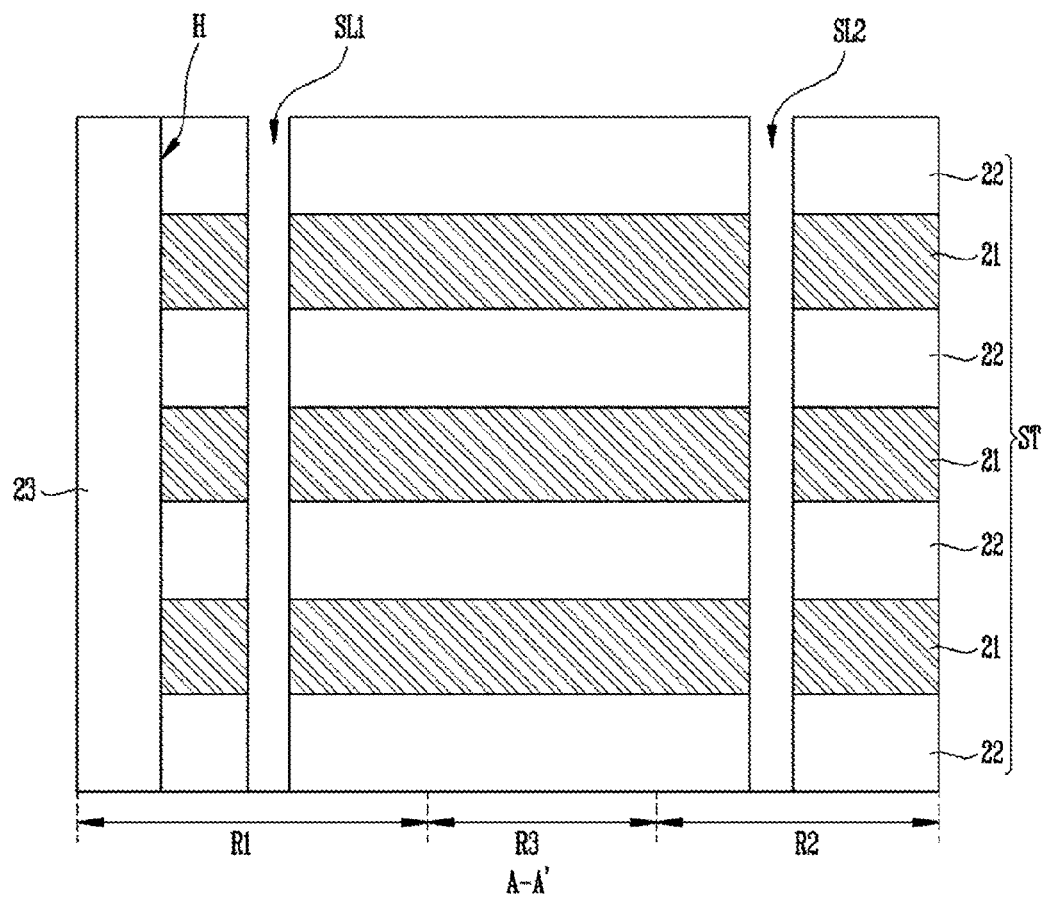
Figure 3A:
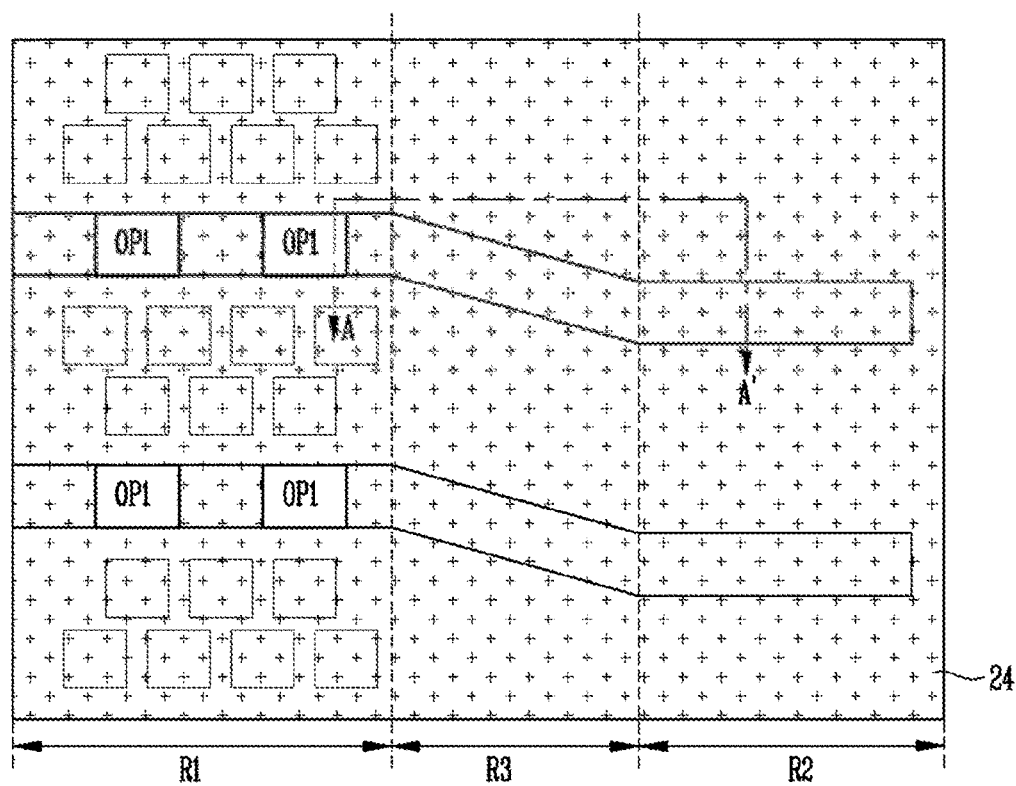
Figure 3B:
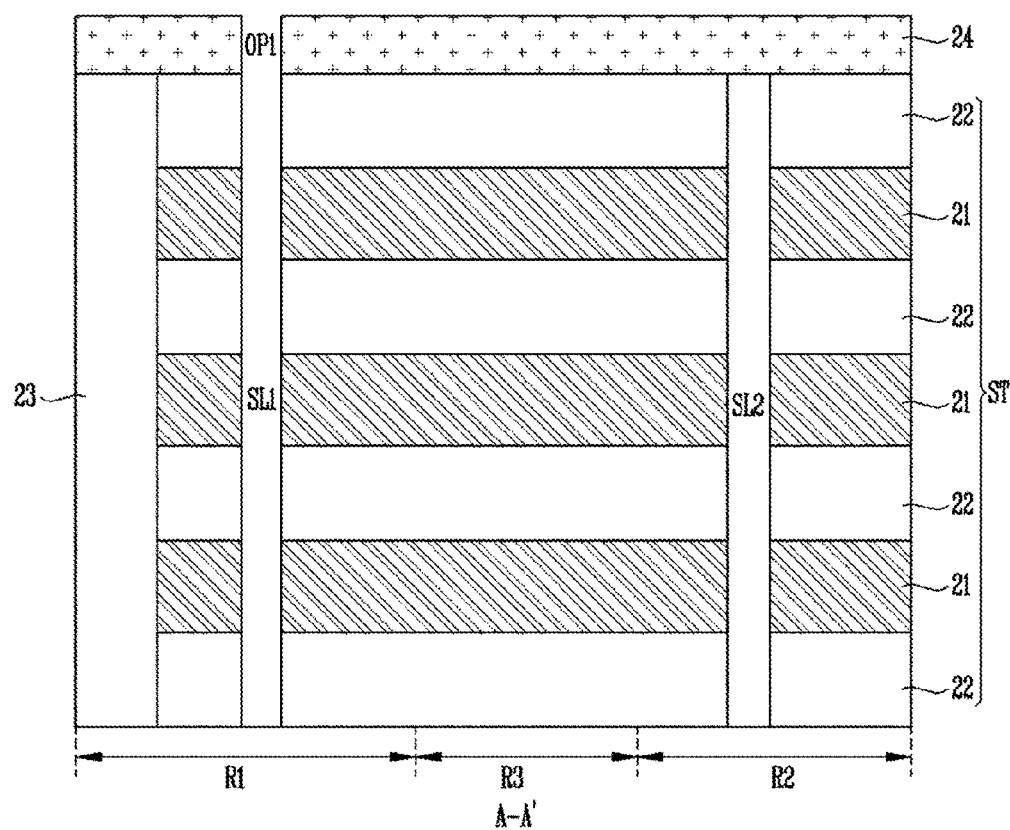
Figure 4A:
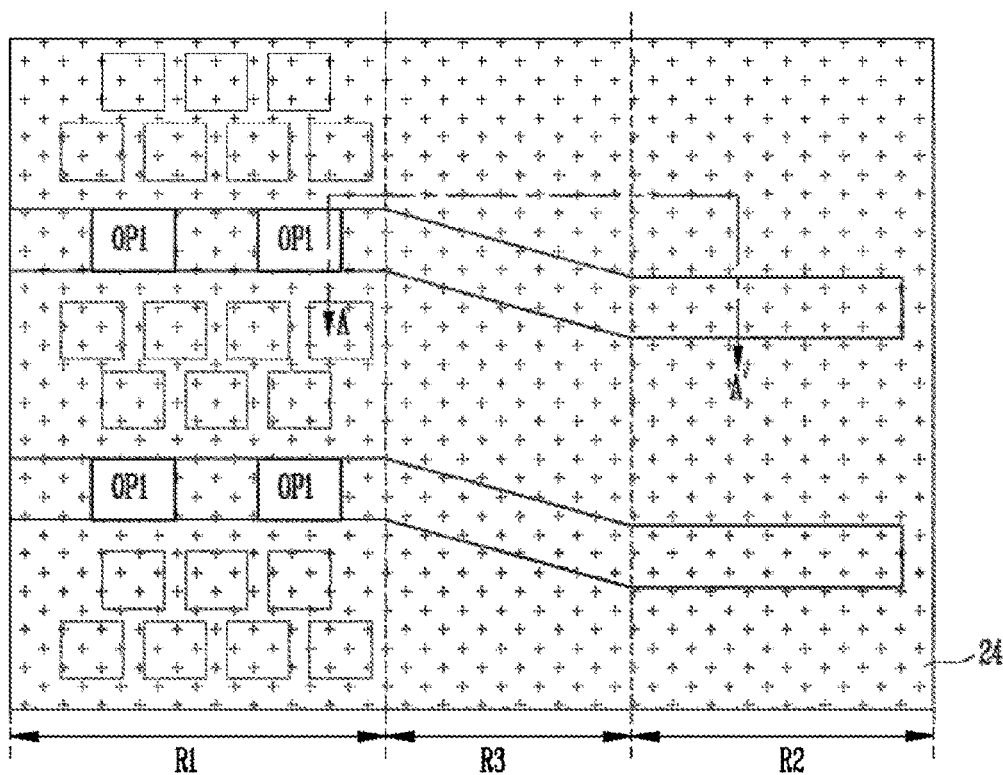
Figure 4B:
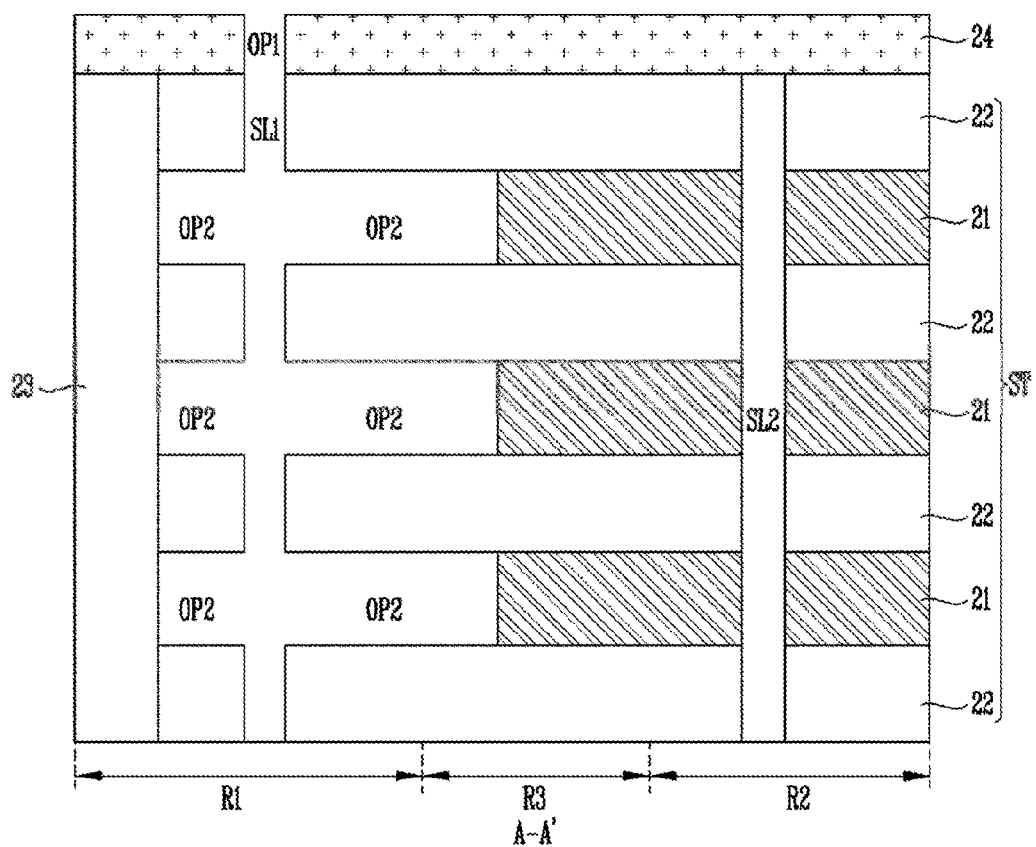
Figure 5A:
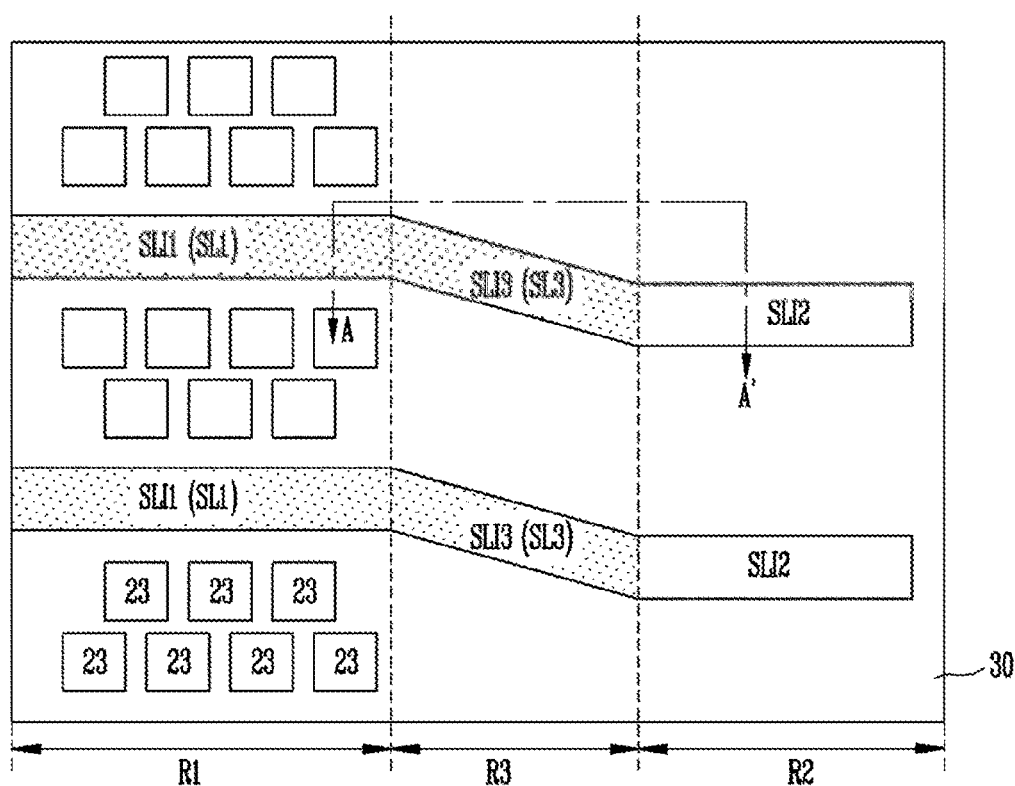
Figure 5B:
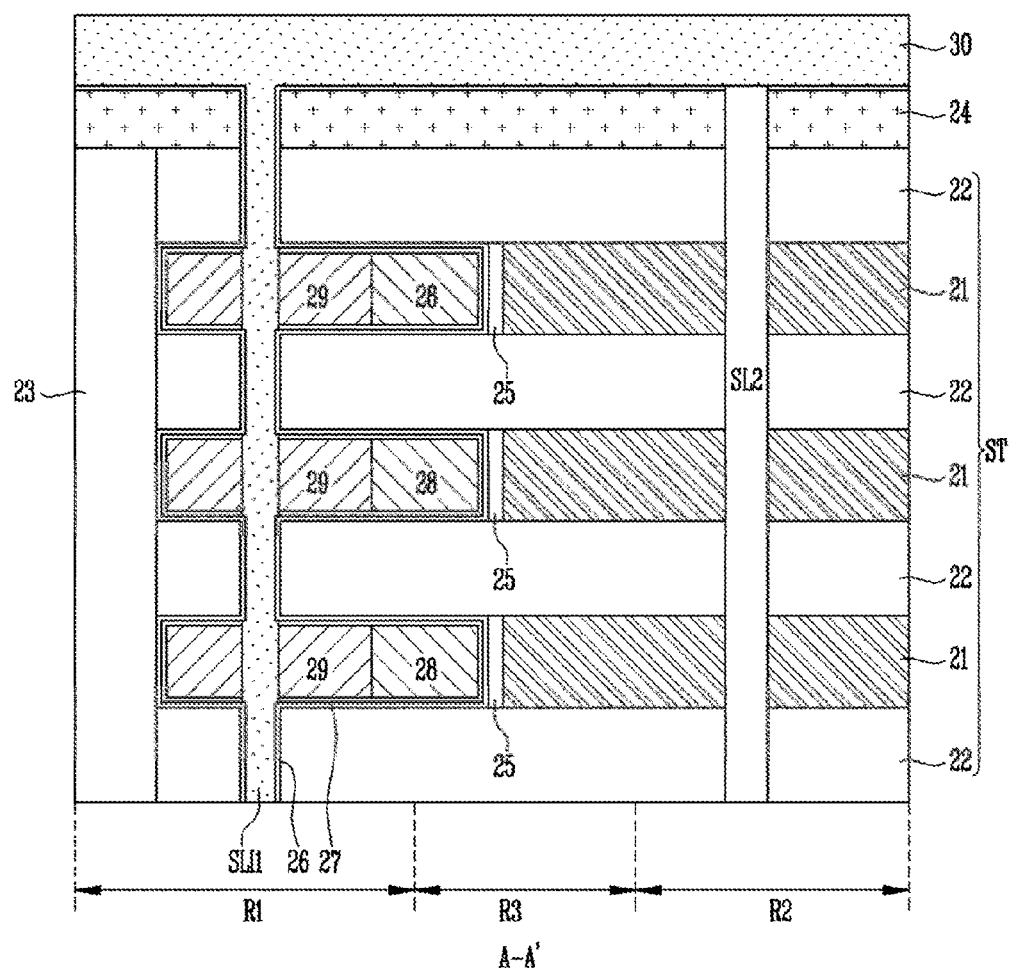
Figure 6A:
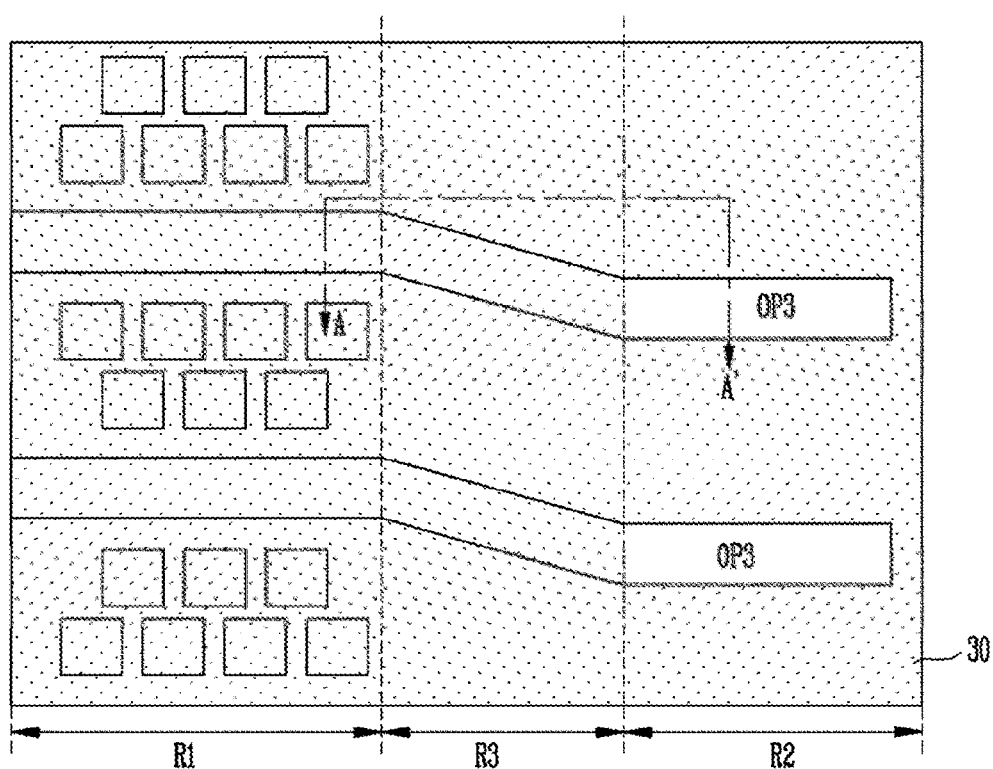
Figure 6B:
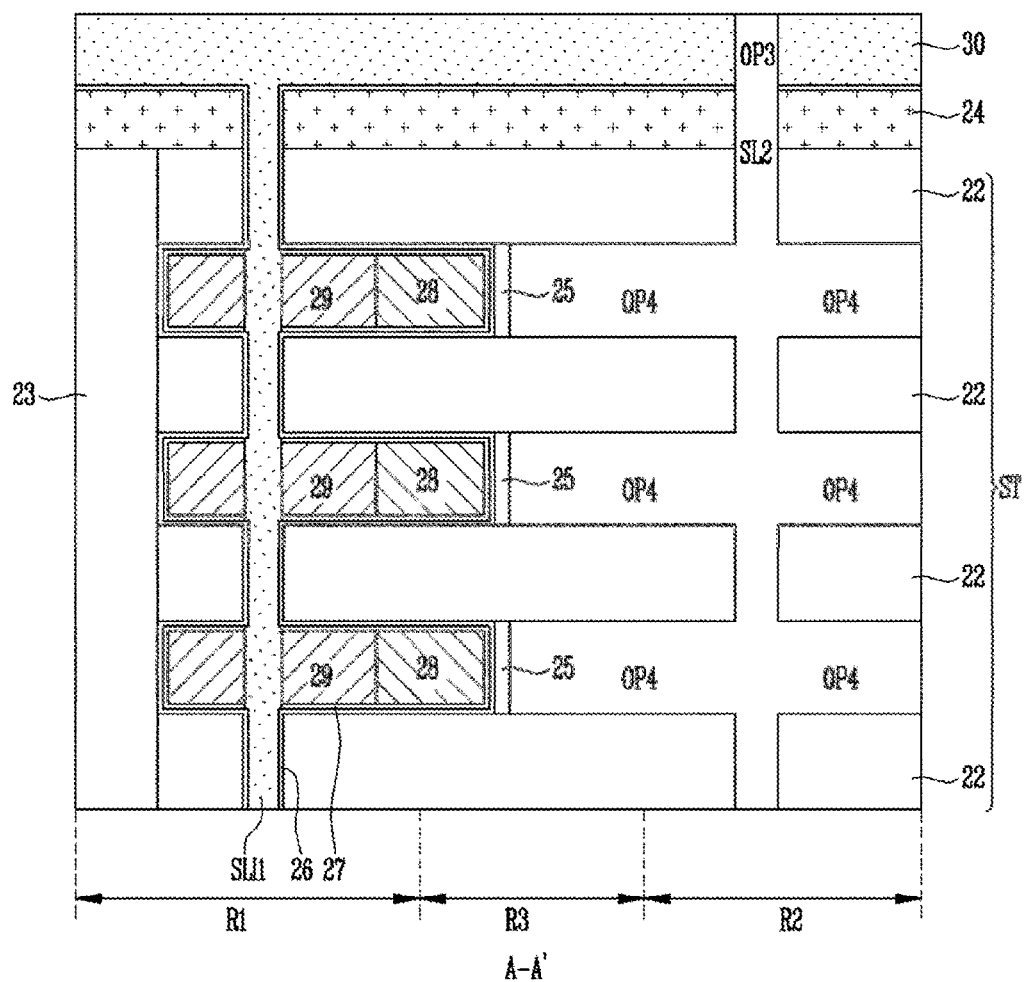
Figure 7A:
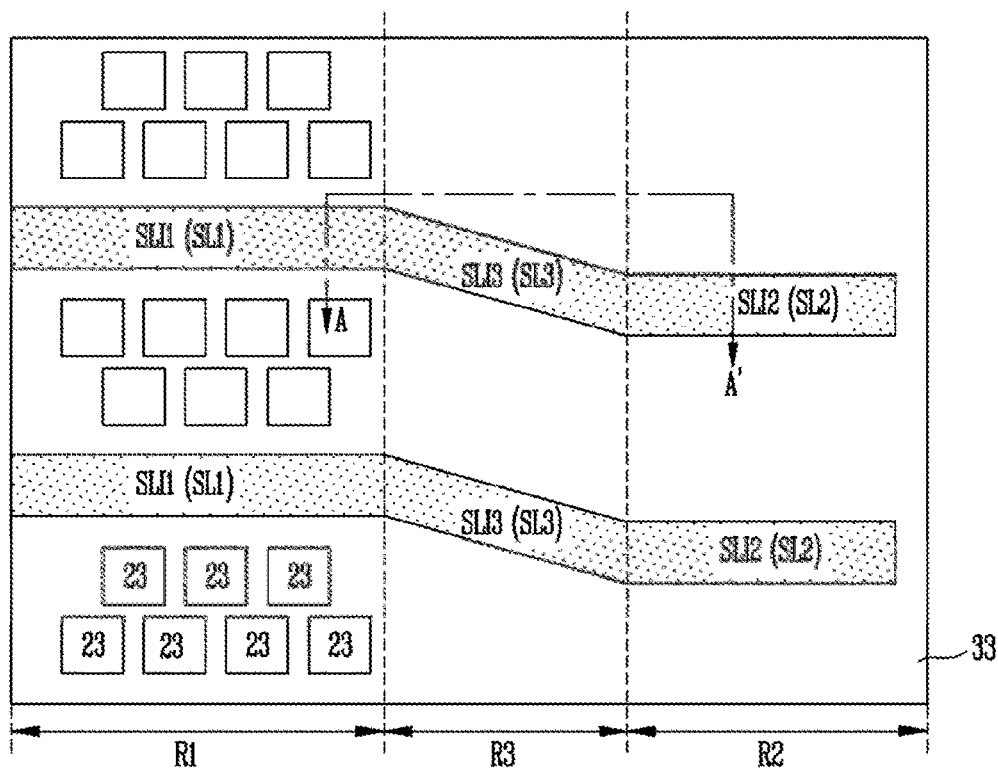
Figure 7B:
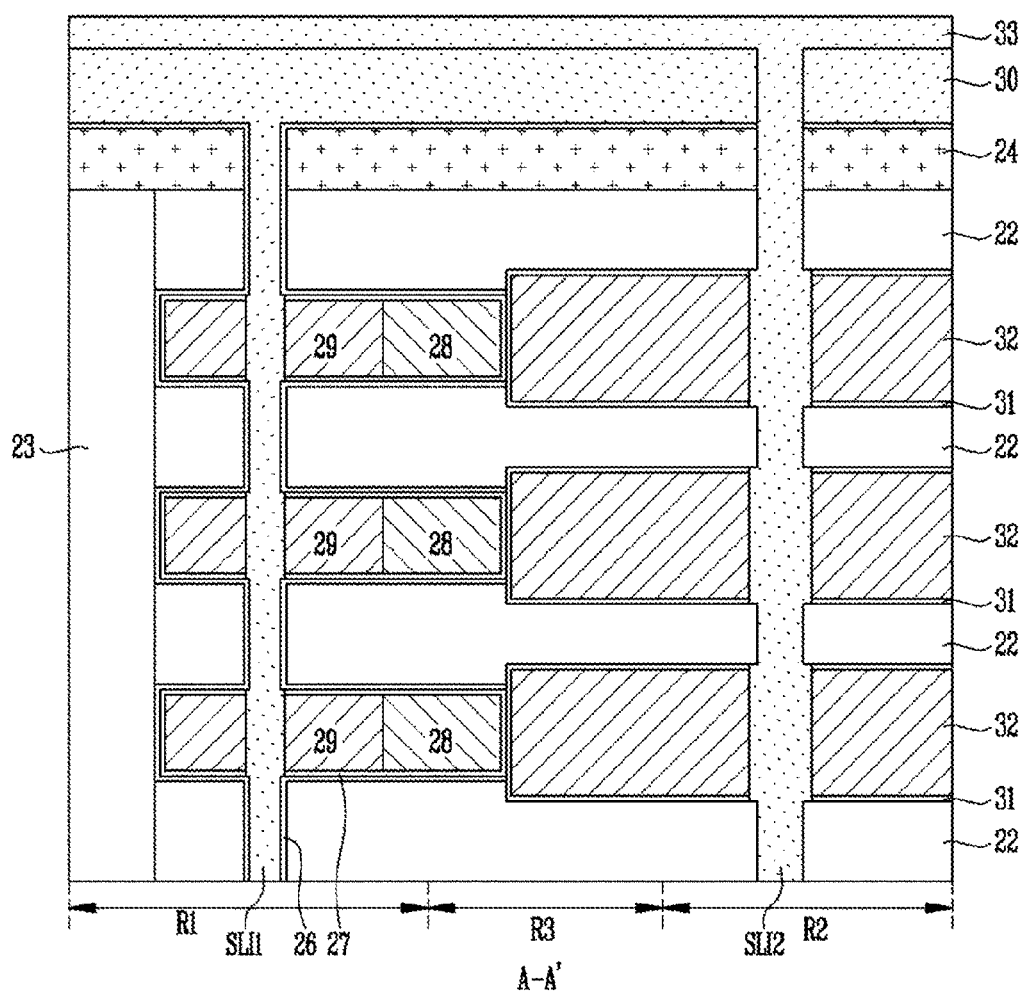

In FIGS. 2A and 2B, a stacked structure ST, in which sacrificial layers 21 and first insulating layers 22 are alternately stacked, is formed. Here, the stacked structure may include first to third regions R1 to R3. For example, the first region R1 may be a cell region, the second region R2 may be a contact region, and the third region R3 may be a spare region. The third region R3 is interposed between the first region R1 and the second region R2, and is the spare region. The third region R3 prevents removal of the sacrificial layer 21 of the second regions R2 during a subsequent removing process of the sacrificial layer 21 in the first region R1. Therefore, a width W2 of the third region R3 is determined so as to maintain a proper distance between a first slit SL1 of the first region R1 and a second slit SL2 of the second region R2. For example, the width W2 of the third region R3 may be in a range of 400 to 600 Å.

The sacrificial layers 21 may be used to form a gate electrode of a selection transistor, a memory cell transistor, and/or the like. Further, the first insulating layers 22 may be used to electrically separate the stacked gate electrodes. The sacrificial layers 21 may be formed by a material having a high etch selectivity with respect to the first insulating layers 22. For example, the sacrificial layers 21 may be formed by a nitride and/or the like, and the first insulating layers 22 may be formed by an oxide and/or the like. In addition, the sacrificial layers 21 may be formed with substantially the same thickness as the first insulating layers 22, or formed with different thicknesses.

Then, a semiconductor pattern 23, which passes through the stacked structure ST, is formed. For example, a hole H, which passes through the stacked structure ST, is formed, and then the semiconductor pattern 23 is formed in the hole H. A center of the semiconductor pattern 23 may be open, or the center may be filled, or a combined structure thereof may be formed. An insulating layer may fill in the open center. In addition, before the formation of the semiconductor pattern 23, a dielectric layer (not shown) may be formed in the hole H. For example, the dielectric layer may include at least one of a charge blocking layer, a data storing layer and a tunnel insulating layer. Here, the data storing layer may include a polysilicon, a nitride, a phase change material, a nanodot, and/or the like.

Here, the first slit SL1 disposed in the first region R1 of the first stacked structure ST, the second slit SL2 disposed in the second region R2, and a third slit SL3 disposed in the third region R3 are formed. For example, firstly, after the third slit SL3 is formed, a third slit insulating layer SLI3 is formed in the third slit SL3. Then, the first slit SL1 and the second slit SL2 are formed. Here, the first and second slits SL1 and SL2 may be formed to overlap the third slit SL3.

Here, the stacked structure ST and the third slit insulating layer SLI3 may be partially etched. Further, the first and second slits SL1 and SL2 are then formed. The third slit insulating layer SLI3 may be used as a supporting structure, which supports the first insulating layers 22 remaining during subsequent removal of sacrificial layers 21. The third slit insulating layer SLI3 may serve to prevent the removal of the sacrificial layers 21 of the second region R2 during the removal of the sacrificial layers 21 through the first slit SL1. In addition, the first and second slits SL1 and SL2 may be used as a path to remove the sacrificial layers 21, and have a depth to expose all of the sacrificial layers 21.

For reference, although not shown in the figures, before or after the formation of the first to third slits SL1 to SL3, a sidewall of the stacked structure ST may be patterned in a stair shape. For example, the second region R2 of the stacked structure ST may be patterned in the stair shape.

Referring again to FIGS. 3A and 3B, a mask pattern 24 is formed on the stacked structure ST. The mask pattern 24 may include at least one first opening OP1 which exposes the first slit SL1. For example, the mask pattern 24 includes the first openings OP1 in an island shape, which intermittently expose the first slit SL1. In addition, the mask pattern 24 may include an oxide layer such as an undoped silicate glass (USG), and/or the like.

Referring once more to FIGS. 4A and 4B, the sacrificial layers 21 of the first region R1 are removed through the first openings OP1 and the first slit SL1. Accordingly, second openings OP2 are formed between remaining first insulating layers 22. Here, the sacrificial layers 21 of the third region R3 may be partially removed. However, since a distance between the first slit SL1 and the second region R2 is ensured through the third region R3, the sacrificial layers 21 of the second region R2 are not removed.

Referring again to FIGS. 5A and 5B, first conductive layers 29 are formed in the second openings OP2. For example, after the first conductive layers 29 are formed in the first slit SL1 and the second openings OP2, a separation process, which removes the first conductive layers 29 formed in the first slit SL1, is performed. As a result, an upper portion and a lower portion of the first conductive layers 29 are electrically separated.

Here, before the formation of the first conductive layers 29, a protection layer 25, a dielectric layer 26, a barrier layer 27, and/or the like, may be further formed. Firstly, a protection layer 25 may be formed on a surface of the sacrificial layers 21, which are exposed through the second openings OP2. For example, a partial thickness of a surface of the sacrificial layers 21 is oxidized, and thus, the protection layer 25 is formed. Here, the protection layer 25 may be removed or may remain in some regions in subsequent processes, and may be used as a charge blocking layer in regions where it remains. Then, the dielectric layer 26 and a first barrier layer 27 are formed along an inner surface of the first slit SL1 and the second openings OP2. Here, the dielectric layer 26 may include at least one of a tunnel insulating layer, a data storage layer, and a charge blocking layer. For example, an aluminum oxide layer ($Al_2O_3$) may be formed as the charge blocking layer. Then, after the formation of the first barrier layer 27 on the dielectric layer 26, a non-conductive material layer 28 may be formed in the second openings OP2. For example, the non-conductive material layer 28 may include an oxide, a nitride, silicon, and/or the like. Then, the non-conductive material layer 28 is partially etched, and thus, an inside of the second openings OP2 is partially reopened, thereby forming the first conductive layers 29 in the reopened second openings OP2. Then, the first barrier layer 27 formed in the first slit SL1 is removed. For example, the first barrier layer 27 is etched through a wet etching process.

For reference, a thermal process having a high temperature may be used in the formation of the protection layer 25. Thus, when the second openings OP2 are also formed in the second region R2, a bending phenomenon, in which the first insulating layers 22 remaining in the second regions R2 are bent, may be caused. In addition, since a conductive layer is simultaneously formed in the second openings OP2 of the first region R1 and the second openings OP2 of the second region R2, the second openings OP2 of the second region R2 have a width greater than the first openings OP1 of the first region R1. Accordingly, the conductive layer in the second openings OP2 of the second region R2 is not filled, thereby causing a punch phenomenon. In addition, when the deposition thickness of the conductive layer is increased so as to completely fill the second openings OP2, the conductive layer is deposited with an increased thickness in the second openings OP2 of the first region R1. As a result, the upper conductive layer and the lower conductive layer may not be completely separated. However, according to an embodiment of the invention, the sacrificial layers 21 of the first region R1 are selectively removed through the first slit SL1, and thus, the above-mentioned phenomenon may not be caused.

Then, a second insulating layer 30 is formed to fill the first slit SL1. Thus, the first slit insulating layer SLI1 is formed in the first slit SL1. Here, the second insulating layer 30 may be formed on the mask pattern 24 or the dielectric layer 26.

Referring once more to FIGS. 6A and 6B, the second insulating layer 30 is etched, and thus, third openings OP3, which expose the second slits SL2, are formed. The third openings OP3 may be formed to be similar to shapes of the second slits SL2.

Then the sacrificial layers 21 of the second region R2 are removed through the third openings OP3 and the second slits SL2, and fourth openings OP4 are formed. Here, the sacrificial layers 21 of the third region R3 may be partially removed, and the protection layers 25 may be exposed.

Referring again to FIGS. 7A and 7B, partial thicknesses of the first insulating layers 22, exposed in the fourth openings OP4, are etched, and widths of the fourth openings OP4 are increased. For example, the first insulating layers 22 are etched using a wet etching process including HF or buffered oxide etchant (BOE). Thus, the width of the fourth opening OP4 may be expanded to 250 to 450 Å. Here, the protection layer 25, which is exposed in the fourth openings OP4, may be removed.

Then, the dielectric layer 26 exposed in the fourth openings OP4 is removed. When the dielectric layer 26 is an aluminum oxide layer, the dielectric layer 26 may be removed using an etchant having an etching selectivity ratio of 1:2 or more between the first barrier layer 27 and the dielectric layer 26. For example, a phosphoric acid may be used as an etchant. Thus, the first barrier layer 27 is exposed.

Then, after a second barrier layer 31 and a second conductive layer 32 are formed in the fourth openings OP4, the second barrier layer 31 formed in the second slit SL2 is removed. Thus, the second conductive layer 32, which has a thickness greater than the first conductive layer 29, is formed. For example, a difference of thicknesses between the first conductive layer 29 and the second conductive layer 32 may be in a range of 30 to 200 Å. In addition, the first conductive layer 29 and the second conductive layer 32 are electrically coupled through the first and second barrier layers 27 and 31.

Then, a third insulating layer 33 is formed so as to fill the second slit SL2. Thus, the second slit insulating layer SLI2 is formed in the second slit SL2. Here, the third insulating layer 33 may be formed on an upper portion of the second insulating layer 30.

As described in the above descriptions, the first conductive layers 29 and the second conductive layers 32 may be formed using the first slit SL1 and the second slit SL2, respectively. Thus, the first conductive layers 29 and the second conductive layers 32, which have different thicknesses, may be formed through different processes, and problems in which the first conductive layers 29 are not completely separated or the second conductive layers 32 do not completely fill the fourth openings OP4 may be solved in a separation process.

Figure 8:
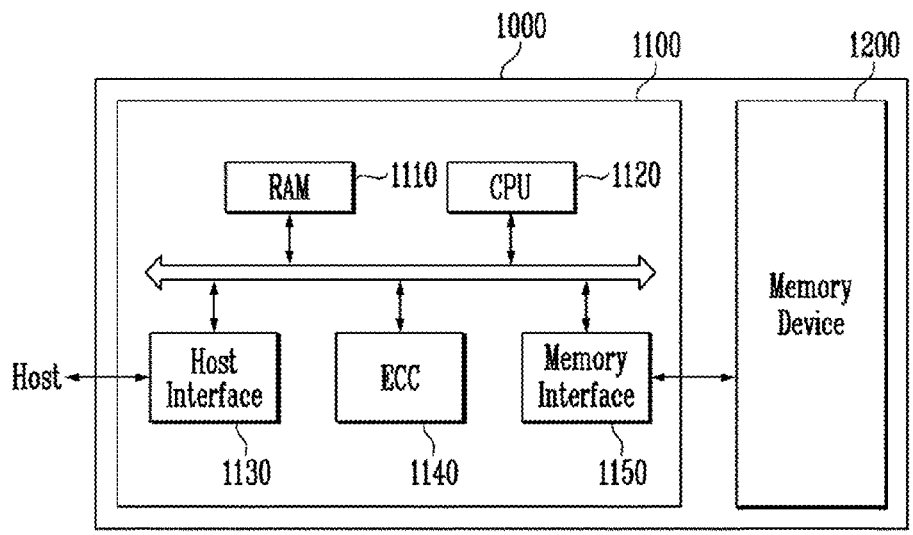
FIGS. 8 and 9 are block diagrams illustrating a structure of a memory system according to an embodiment of the invention.

Referring to FIG. 8, a block diagram illustrating a structure of a memory system according to an embodiment of the invention is shown.

As shown in FIG. 8, the memory system 1000 according to an embodiment of the invention includes a memory device 1200 and a controller 1100.

The memory device 1200 is used to store data information having various data forms such as text, graphics, software codes, and/or the like. The memory device 1200 may be a nonvolatile memory, and include the structure described with reference to FIGS. 1 to 7B. In addition, the memory device 1200 includes a stacked structure having conductive layers and insulating layers which are alternately stacked. The memory device 1200 may also include semiconductor patterns which pass through the stacked structure. Further, the memory device 1200 may also include contact plugs, which are electrically coupled to the conductive layers, respectively, wherein each of the conductive layers includes a first region having a first thickness and a second region having a second thickness greater than the first thickness, and a second region of a lower conductive layer is disposed under a second region of the conductive layer. A structure of the memory device 1200 and a method of manufacturing the memory device 1200 are the same as described above, and thus, detailed explanations will be omitted.

The controller 1100 is electrically coupled to a host Host and the memory device 1200, and is configured to access the memory device 1200 in response to a request of the host Host. For example, the controller 1100 is configured to control read, write, erase, and background operations, and/or the like, of the memory device 1200.

The controller 1100 includes a random access memory (RAM) 1110, a central processing unit (CPU) 1120, a host interface 1130, and an error correction code (ECC) circuit 1140, a memory interface 1150, and/or the like.

The RAM 1110 is configured to be used as an operation memory of the CPU 1120, a cache memory interposed between the memory device 1200 and the host Host, and a buffer memory interposed between the memory device 1200 and the host Host. For reference, the RAM 1110 may be substituted by a static random access memory (SRAM), a read only memory (ROM), and/or the like.

The CPU 1120 is configured to control overall operations of the controller 1100. For example, the CPU 1120 may be configured to operate firmware such as a flash translation layer (FTL) stored in the RAM 1110, and/or the like.

The host interface 1130 is configured to interface with the host Host. For example, the controller 1100 is configured to communicate with the host Host through at least one of various interface protocols such as a Universal Serial Bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, and/or the like.

The error correction block 1140 detects and corrects an error included in data read from the memory device 1200 using an error correction code (ECC).

The memory interface 1150 is configured to interface with the memory device 1200. For example, the memory interface 1150 includes a NAND interface or a NOR interface.

For reference, the controller 1100 may further include a buffer memory which temporarily stores data. Here, the buffer memory may be used to temporarily store data transmitted to the outside through the host interface 1130, or temporarily store data transmitted from the memory device 1200 through the memory interface 1150. In addition, the controller 1100 may further include a ROM which stores code data to interface with the host Host.

As described in the above descriptions, the memory system 1000 according to an embodiment of the invention includes the memory device 1200 having the stable structure and improved integration, and thus, integration of the memory system 1000 may also be improved.

Figure 9:
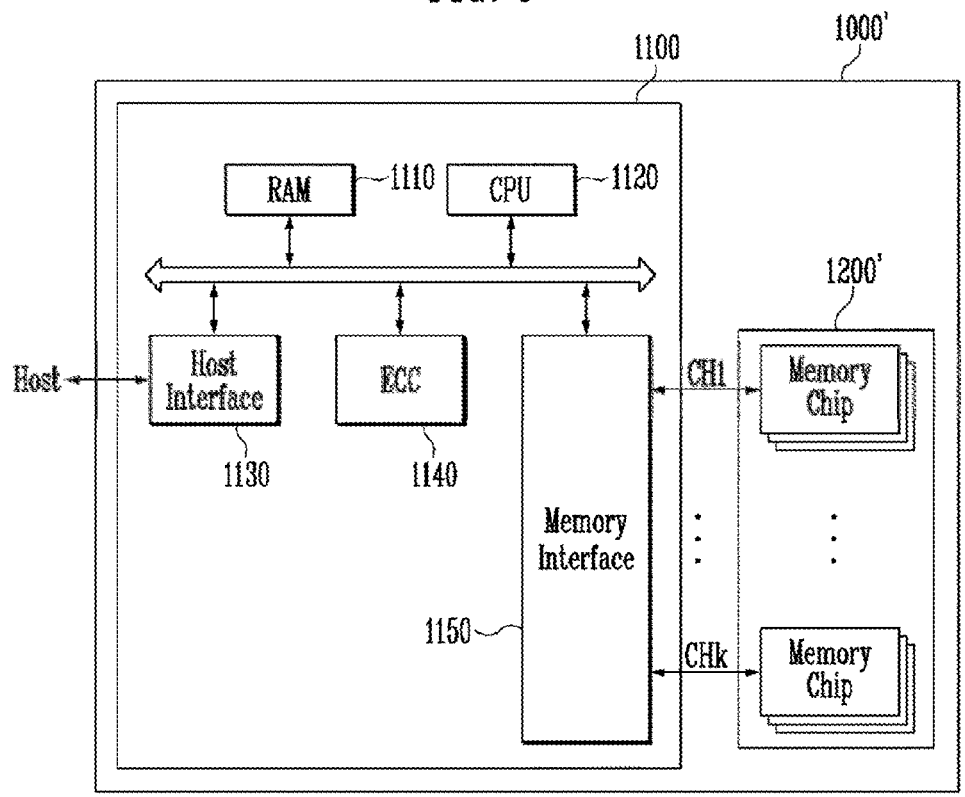

Referring to FIG. 9, a block diagram illustrating a structure of a memory system according to an embodiment of the invention is shown. Hereinafter, any repetitive explanations concerning the above-described contents will be omitted.

As shown in FIG. 9, the memory system 1000' according to an embodiment of the invention includes a memory device 1200' and a controller 1100. In addition, the controller 1100 includes a RAM 1110, a CPU 1120, a host interface 1130, and an ECC circuit 1140, a memory interface 1150, and/or the like.

The memory device 1200' may be a nonvolatile memory, and include the memory string described with reference to FIGS. 1 to 7B. In addition, the memory device 1200' includes a stacked structure including conductive layers and insulating layers which are alternately stacked. The memory device 1200' also includes semiconductor patterns which pass through the stacked structure. In addition, the memory device 1200' also includes contact plugs respectively electrically coupled to the conductive layers, wherein each of the conductive layers includes a first region having a first thickness and a second region electrically coupled to the first region and having a second thickness greater than the first thickness, and is configured that a second region of a lower conductive layer is disposed under a second region of an upper conductive layer. A structure of the memory device 1200' and a method of manufacturing the memory device 1200' are the same as described above, and thus, detailed explanations will be omitted.

In addition, the memory device 1200' may be a multi-chip package including a plurality of memory chips. The plurality of the memory chips are divided into a plurality of groups. Further, the plurality of the groups are configured to communicate with the controller 1100 through first to $k^{th}$ channels CH1 to CHk. Moreover, memory chips included in one group are configured to communicate with the controller 1100 through a common channel. For reference, the memory system 1000' may be changed so that one memory chip is electrically coupled to one channel.

As described in the above descriptions, the memory system 1000' according to an embodiment of the invention includes the memory device 1200' having the stable structure and improved integration, and thus, integration of the memory system 1000' may also be improved. In particular, since the memory device 1200' may constitute the multi-chip package, a data storage capacity of the memory system 1000' may be increased, and a driving speed may be improved.

Figure 10:
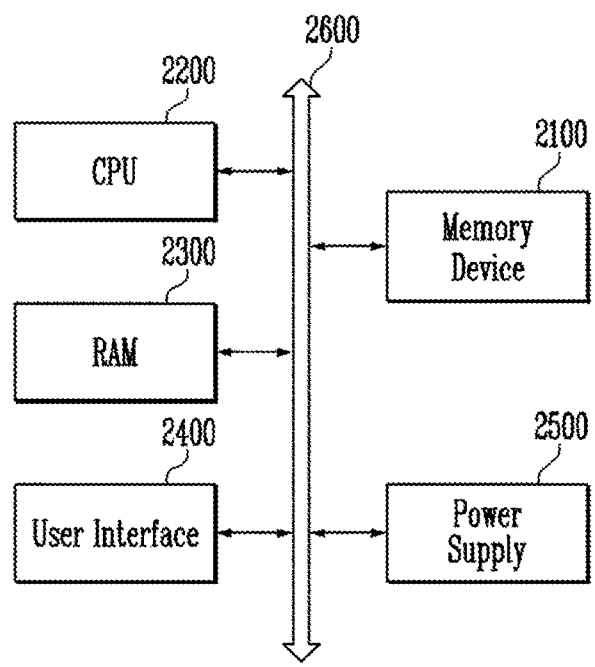
FIGS. 10 and 11 are block diagrams illustrating a structure of a computing system according to an embodiment of the invention.

Referring to FIG. 10, a block diagram illustrating a structure of a computing system according to an embodiment of the invention is shown. Hereinafter, any repetitive explanations concerning the above-described contents will be omitted.

As shown in FIG. 10, the computing system 2000 according to an embodiment of the invention includes a memory device 2100, a CPU 2200, a RAM 2300, a user interface 2400, a power supply 2500, a system bus 2600, and/or the like.

The memory device 2100 stores data provided through the user interface 2400, data processed by the CPU 2200, and/or the like. In addition, the memory device 2100 is electrically coupled to the CPU 2200, the RAM 2300, the user interface 2400, the power supply 2500, and/or the like through the system bus 2600. For example, the memory device 2100 may be electrically coupled to a controller (not shown) through the system bus 2600, or directly electrically coupled to the system bus 2600. When the memory device 2100 is directly electrically coupled to the system bus 2600, a function of the controller may be performed by the CPU 2200, the RAM 2300, and/or the like.

Here, the memory device 2100 may be a nonvolatile memory, and may include the memory string described with reference to FIGS. 1 to 7B. In addition, the memory device 2100 includes a stacked structure including conductive layers and insulating layers which are alternately stacked. The memory device 2100 also includes semiconductor patterns which pass through the stacked structure. Further, the memory device 2100 also includes contact plugs respectively electrically coupled to the conductive layers, wherein each of the conductive layers includes a first region having a first thickness and a second region electrically coupled to the first region and having a second thickness greater than the first thickness, and is configured that a second region of a lower conductive layer is disposed under a second region of an upper conductive layer. A structure of the memory device 2100 and a method of manufacturing the memory device 2100 are the same as described above, and thus, detailed explanations will be omitted.

Also, the memory device 2100 may be the multi-chip package described in FIG. 9, which includes a plurality of memory chips.

The computing system 2000 having the above-mentioned structure may be a computer, an ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game player, a navigation device, a black box, a digital camera, a 3-dimensional television, a digital audio recorder, a digital audio player, a digital picture recorder, a digital picture player, a digital video recorder, a digital video player, a device which receives or transmits information in a wireless environment, one of various electronic devices included in a home network, one of various electronic devices included in a computer network, one of various electronic devices included in a telematics network, an RFID device, etc.

As described in the above descriptions, since the computing system 2000 according to an embodiment of the invention includes the memory device 2100 having the stable structure and improved integration, a data storage capacity of the computing system 2000 may be increased.

Figure 11:
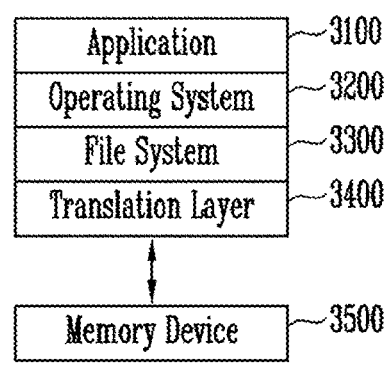

Referring to FIG. 11, a block diagram illustrating a computing system according to an embodiment of the invention is described.

As shown in FIG. 11, the computing system 3000 according to an embodiment of the invention includes a software layer, which has an operating system 3200, an application 3100, a file system 3300, a translation layer 3400, and/or the like. In addition, the computing system 3000 includes a hardware layer such as a memory device 3500.

The operating system 3200 is configured to manage software, hardware resources, and/or the like, of the computing system 3000, and control program execution of a CPU. The application 3100 may be a utility executed by the operating system 3200 as various application programs which is executed in the computing system.

The file system 3300 denotes a logic structure, which manages data, files, and/or the like, existing in the computing system 3000, and organizes a file to be stored in the memory device 3500 or data based on a regulation. The file system 3300 may be determined based on the operating system 3200 used in the computing system 3000. For example, when the operating system 3200 is the Windows series of the Microsoft Corporation, the file system 3300 may be a file allocation table (FAT), an NT file system (NTFS), and/or the like. In addition, when the operating system 3200 is the Unix/Linux series, the file system 3300 may be an extended file system (EXT), a Unix file system (UFS), a journaling file system (JFS), and/or the like.

In the figure, the operating system 3200, the application 3100, and the file system 3300 are described as individual blocks. However, the application 3100 and the file system 3300 may be included in the operating system 3200.

The translation layer 3400 may change an address into a proper address type of the memory device 3500 in response to a request from the file system 3300. For example, the translation layer 3400 may change a logic address generated from the file system 3300 into a physical address of the memory device 3500. Here, mapping information of the logic address and the physical address may be stored in the address translation table. For example, the translation layer 3400 may be a flash translation layer (FTL), a universal flash storage link layer (ULL), and/or the like.

The memory device 3500 may be a nonvolatile memory, and include the memory string described with reference to FIGS. 1 to 7B as previously explained. In addition, the memory device 3500 includes a stacked structure including conductive layers and insulating layers which are alternately stacked. The memory device 3500 also includes semiconductor patterns which pass through the stacked structure. Further, the memory device 3500 also includes contact plugs respectively electrically coupled to the conductive layers, wherein each of the conductive layers includes a first region having a first thickness and a second region electrically coupled to the first region and having a second thickness greater than the first thickness, and is configured that a second region of a lower conductive layer is disposed under a second region of an upper conductive layer. A structure of the memory device 3500 and a method of manufacturing the memory device 3500 are the same as described above, and thus, detailed explanations will be omitted.

The computing system 3000 having the above-mentioned structure may be classified into an operating system layer performed in an upper level region and a controller layer performed in a lower level region. Here, the application 3100, the operating system 3200, and the file system 3300 may be included in the operating system layer, and may be operated by an operation memory of the computing system 3000. In addition, the translation layer 3400 may be included in the operating system layer, or the controller layer.

As described in the above descriptions, since the computing system 3000 according to an embodiment of the invention includes the memory device 3500 having the stable structure and improved integration, a data storage capacity of the computing system 3000 may be increased.

According to embodiments of the invention, during a formation of stacked conductive layers, a thickness of a pad region may be selectively increased. Accordingly, a bridge, which may be caused by passing through the conductive layers during a formation of a contact plug may be prevented. In addition, thicknesses of end terminals of the stacked gate electrodes are selectively increased, and a height of the stacked structure may be decreased. Thus, integration of a semiconductor device may be improved.

Hereinafter the invention is explained with reference to embodiments, it will be apparent to those skilled in the art that various modifications can be made to the above-described embodiments of the invention without departing from the spirit or scope of the invention. Here, the essential technical scope of the invention is disclosed in the appended claims, and it is intended that the invention cover all such modifications provided they come within the scope of the claims and their equivalents.

What is claimed is:

1. A method of manufacturing a semiconductor device, comprising:
   forming a stacked structure in which sacrificial layers and insulating layers are alternately stacked and a first region and a second region are defined;
   forming a first slit which passes through the first region of the stacked structure and a second slit which passes through the second region;
   forming a mask pattern which covers the second slit and exposes the first slit on the stacked structure;
   forming first openings by removing the sacrificial layers of the first region through the first slit;
   forming first conductive layers in the first openings;
   forming a first slit insulating layer which fills the first slit;
   forming second openings by removing the sacrificial layers of the second region through the second slit; and
   forming second conductive layers in the second openings.

2. The method of claim 1, wherein the mask pattern covers the first and second regions and comprises third openings in island shapes intermittently exposing the first slit.

3. The method of claim 1, further comprising:
   etching the mask pattern to expose the second slit before the forming of the second openings.

4. The method of claim 1, further comprising:
   forming protection layers on surfaces of the sacrificial layers exposed in the first openings before the forming of the first conductive layers.

5. The method of claim 4, further comprising:
   removing the protection layers exposed through the second openings before the forming of the second conductive layers.

6. The method of claim 1, further comprising:
   forming a nonconductive material layer in a part of the second openings before the forming of the second conductive layers.

7. The method of claim 1, wherein the first conductive layer and the second conductive layer, which are formed at substantially the same level, electrically couple to each other.

8. The method of claim 1, wherein the stacked structure further comprises:
   a third region interposed between the first region and the second region.

9. The method of claim 8, further comprising:
   forming a third slit located in the third region of the stacked structure before the forming of the first and second slits; and
   forming a third slit insulating layer in the third slit.

10. The method of claim 9, wherein the first and second slits are configured to overlap the third slit.

11. The method of claim 8, further comprising:
    partially etching the insulating layers to expand thicknesses of the second openings.

* * * * *